(12) United States Patent
Guo et al.

(10) Patent No.: US 8,385,858 B2
(45) Date of Patent: Feb. 26, 2013

(54) POWER AMPLIFIER AND SIGNAL TRANSCEIVING SYSTEM

(75) Inventors: Jiangyi Guo, Shenzhen (CN); Pinghua He, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 287 days.

(21) Appl. No.: 12/854,015

(22) Filed: Aug. 10, 2010

(65) Prior Publication Data

US 2010/0323646 A1 Dec. 23, 2010

Related U.S. Application Data

(63) Continuation of application No. PCT/CN2009/071704, filed on May 8, 2009.

(30) Foreign Application Priority Data

May 21, 2008 (CN) .......................... 2008 1 0067384

(51) Int. Cl.
*H04B 1/04* (2006.01)
(52) U.S. Cl. ....................................... 455/127.1; 455/91
(58) Field of Classification Search ............. 455/91–129
See application file for complete search history.

(56) References Cited

U.S. PATENT DOCUMENTS

| | | | | |
|---|---|---|---|---|
| 4,626,962 A | * | 12/1986 | Ahn et al. | ..................... 361/758 |
| 2002/0079970 A1 | | 6/2002 | Morimoto et al. | |
| 2003/0117219 A1 | | 6/2003 | Yamamoto et al. | |
| 2003/0122716 A1 | | 7/2003 | Ellis et al. | |
| 2004/0125579 A1 | | 7/2004 | Konishi et al. | |
| 2005/0009484 A1 | | 1/2005 | Imai et al. | |
| 2007/0249304 A1 | * | 10/2007 | Snelgrove et al. | ......... 455/127.2 |
| 2008/0012645 A1 | | 1/2008 | Ichitsubo et al. | |
| 2008/0088376 A1 | | 4/2008 | Tateoka et al. | |

FOREIGN PATENT DOCUMENTS

| | | |
|---|---|---|
| CN | 1424762 A | 6/2003 |
| CN | 1512578 A | 7/2004 |
| CN | 1577853 A | 2/2005 |
| CN | 101162928 A | 4/2008 |

OTHER PUBLICATIONS

International Search Report dated Aug. 13, 2009 in connection with PCT Application No. PCT/CN2009/071704.
Written Opionion of the International Searchign Authority dated Aug. 13, 2009 in connection with PCT Application No. PCT/CN2009/071704.

* cited by examiner

*Primary Examiner* — Lana N Le

(57) ABSTRACT

A power amplifier and a signal transmitting system using the power amplifier are disclosed. The power amplifier includes a circuit board, a power amplifier, and a structural component. The circuit board is fixed on the structural component. The power amplifier is fixed on the circuit board or the structural component. A grounding reference layer is set on the structural component. A pair of pins is set on the power amplifier. A pair of housing portions is set between the circuit board and the structural component. Overhead matching areas are set face to face with the housing portions on the circuit board respectively. Power amplification matching portions are set face to face with the reference layer on the matching areas respectively. The pins are electrically connected to the power amplification matching portions respectively.

12 Claims, 2 Drawing Sheets

POWER AMPLIFIER AND SIGNAL TRANSCEIVING SYSTEM

CROSS-REFERENCE TO RELATED APPLICATIONS

This application is a continuation of International Application No. PCT/CN2009/071704, filed on May 8, 2009, which claims priority to Chinese Patent Application No. 200810067384.3, filed on May 21, 2008, both of which are hereby incorporated by reference in their entireties.

TECHNICAL FIELD

The present invention relates to the communications technology, and more particularly to a power amplifier and a signal transceiving system.

BACKGROUND

In the present mobile telecommunication signal transceiving system, such as a wireless base station, a power amplifier is an indispensable component to improve the performance of signal transmitting. However, standards concerning structure and design of a power amplifier have long been unified in the power amplifier field. During R&D and manufacture of communication devices, communications device manufacturers always purchase power amplifiers manufactured by third-party manufacturers to reduce the costs of R&D and manufacture. Therefore, factors affecting the performance of power amplification are covered by the design of a circuit board and a structural component that bear the amplifier.

FIG. 1 is a structural schematic diagram of a communications device in the prior art. The communications device includes a power amplifier 1, a circuit board 2, and a structural component 3. The structural component 3 is made of an electrically conductive material and is grounded. The circuit board 2 is attached to the structural component 3. The power amplifier 1 is fixed on the structural component 3 by a slot 22 on the circuit board 2. Copper foil 24 is printed on the lower surface of the circuit board 2. The copper foil 24 is grounded through the structural component 3. Power amplification matching joints 23 made of an electrically conductive material are attached to both sides of the slot 22, and pins 12 on both sides of the power amplifier 1 are lapped on the power amplification matching joints 23 respectively.

During use, because the copper foil 24 is grounded, the power amplification matching joints 23 directly refer to the grounded copper foil 24 on the lower surface of the circuit board 2, and the part between the power amplification matching joints 23 and the copper foil 24 becomes an intermediate medium used by the power amplification matching joints 23 as a reference for impedance matching. Therefore, the circuit board 2 generally needs to use a high-frequency board with good impedance continuity and consistency and with less loss in high-frequency signals, to guarantee the stability of the power amplification effectiveness of the power amplifier 1 and to increase the operating efficiency of the power amplifier 1 as much as possible. But because high-frequency boards are expensive, the use of high-frequency boards will increase the costs of entire devices.

Therefore, a new device matching a power amplifier is required, so that without using a high-frequency board, the circuit board can still enable a power amplifier to have relatively stable power amplification effectiveness and relatively high operating efficiency.

SUMMARY

The embodiments of the present invention provide a power amplifier and a signal transceiving system. An intermediate medium between power amplification matching joints and a grounding reference layer can be flexibly selected according to actual needs.

The embodiments of the present invention provide a power amplifier, and the power amplifier includes a circuit board, a power amplifier, and a structural component. The circuit board is set on the structural component. The power amplifier is set on the circuit board and/or the structural component. The power amplifier has a pair of pins. A grounding reference layer is set face to face with the circuit board on the structural component. A pair of housing portions is set between the circuit board and the structural component. Overhead matching areas are set face to face with the housing portions on the circuit board respectively. Power amplification matching portions are set face to face with the reference layer on the matching areas respectively. The pins are electrically connected to the power amplification matching portions respectively.

The embodiments of the present invention provide a signal transceiving system using the power amplifier, and the signal transceiving system includes a power amplifier, a filter, and an antenna component. The power amplifier includes a circuit board, a power amplifier, and a structural component. The circuit board is set on the structural component. The power amplifier is set on the circuit board and/or the structural component. The power amplifier has a pair of pins. A grounding reference layer is set face to face with the circuit board on the structural component. A pair of housing portions is set between the circuit board and the structural component. Overhead matching areas are set face to face with the housing portions on the circuit board respectively. Power amplification matching portions are set face to face with the reference layer on the matching areas respectively. The pins are electrically connected to the power amplification matching portions respectively.

In the embodiments of the present invention, high-frequency materials can be filled in the housing portions as intermediate mediums of impedance matching, to meet the impedance matching needs of a power amplifier, and thus both the power amplifier and the signal transceiving system provided by the embodiments of the present invention can use relatively cheap circuit board materials to reduce the costs effectively without compromising the effectiveness of power amplification.

DETAILED DESCRIPTION

The technical solution of the present invention is clearly and completely described in the following with reference to the accompanying drawings. It should be understood that the embodiments to be described are only part of rather than all of the embodiments of the present invention. Additionally, all other embodiments, which can be derived by those skilled in the art from the embodiments given herein without any creative efforts, fall within the scope of the present invention.

Figure 1:
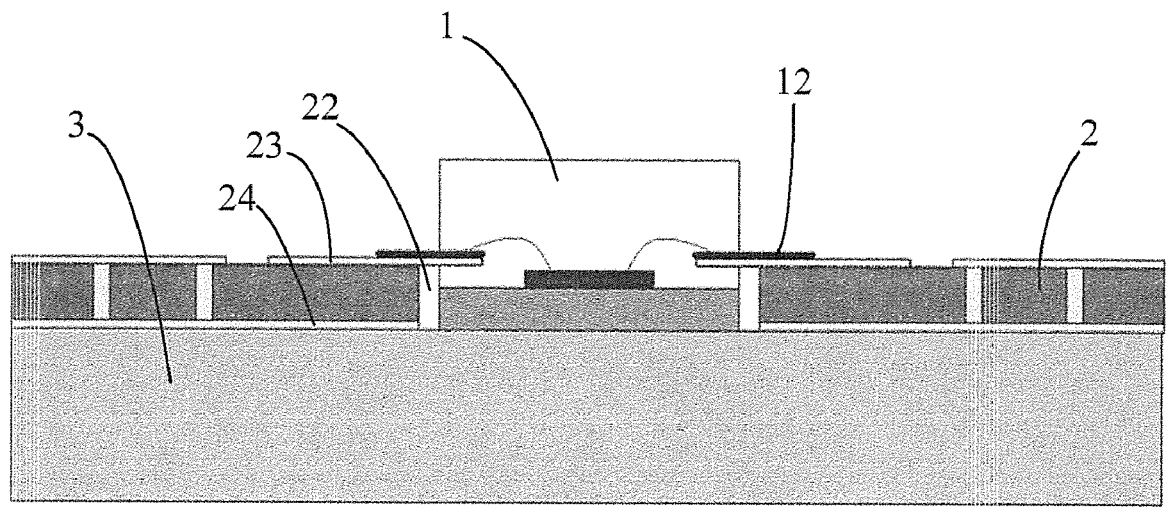
FIG. 1 is a structural schematic diagram of a communications device in the prior art.
Figure 2:
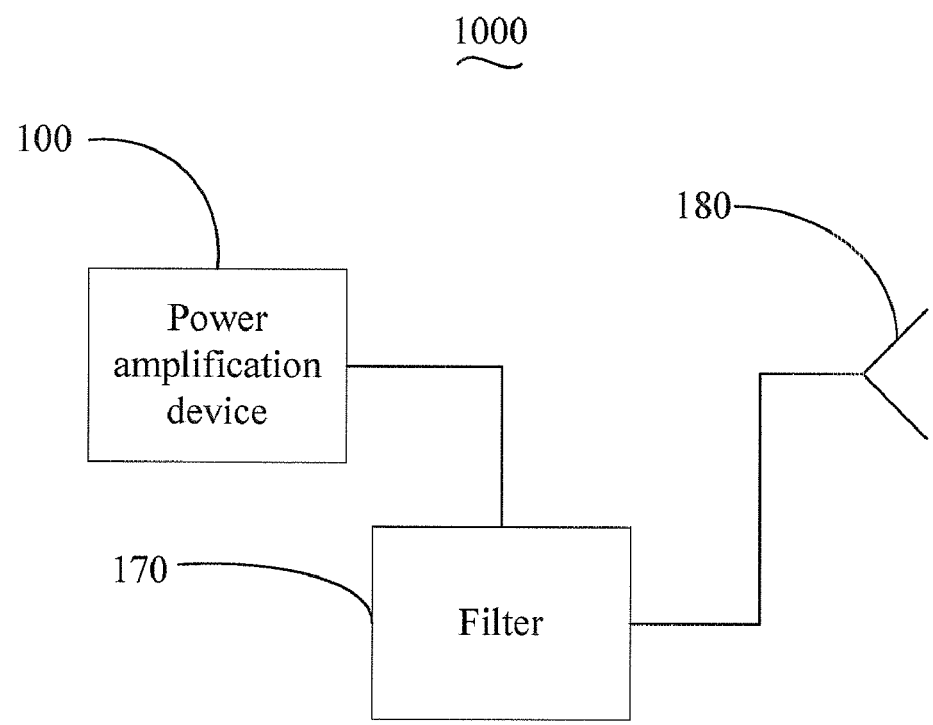
FIG. 2 is a structural schematic diagram of a signal transceiving system according to an embodiment of the present invention.

FIG. 2 is a structural schematic diagram of a signal transceiving system 1000 according to the embodiment of the present invention. The signal transceiving system 1000 includes a power amplifier 100, a filter 170 electrically connected to the power amplifier 100, and an antenna component 180 electrically connected to the filter 170.

Figure 3:
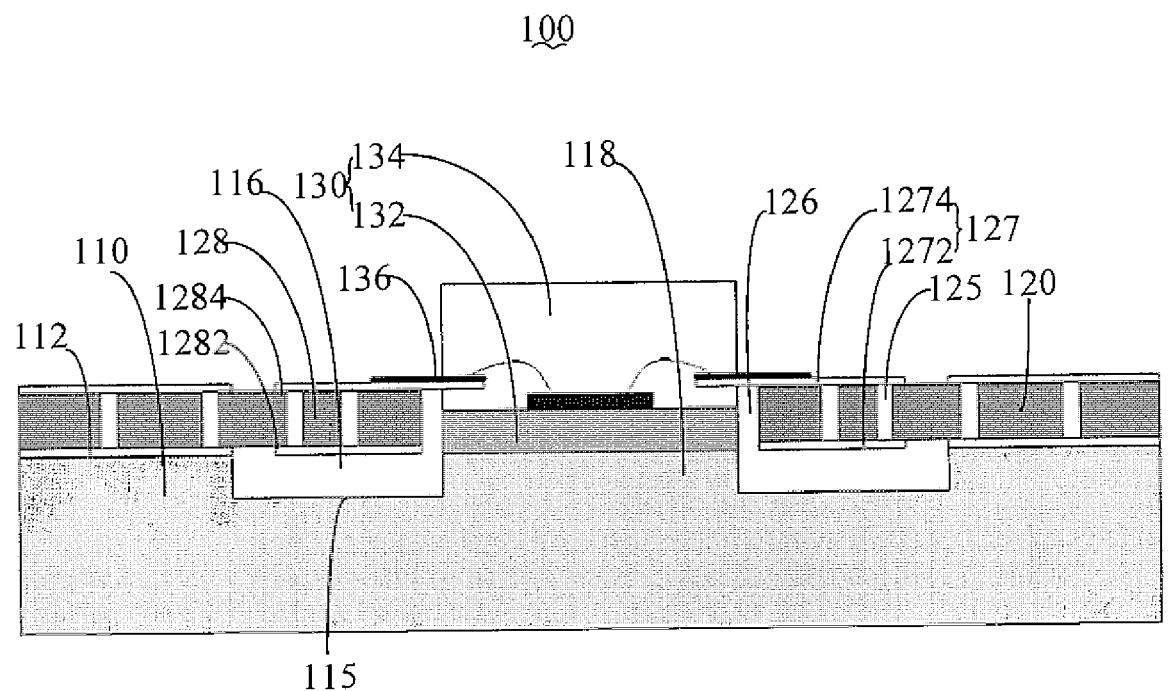
FIG. 3 is a structural schematic diagram of a power amplifier according to an embodiment of the present invention.

FIG. 3 is a schematic diagram of a power amplifier 100 according to an embodiment of the present invention. The power amplifier 100 includes a structural component 110, a circuit board 120, and a power amplifier 130. The structural component 110 is made of an electrically conductive material, and is grounded. The circuit board 120 may be a single-layer board or a multi-layer board. The power amplifier 130 is electrically connected to a circuit on the circuit board 120.

In the embodiment, a first surface 112 is set on the structural component 110. A pair of recessed housing portions 116 is set in parallel on the first surface 112 of the structural component 110. Correspondingly, a raised portion 118 is formed between the housing portions 116. The power amplifier 130 is fixed on the raised portion 118. It should be easily understood that the raised portion 118 rises above the surface of the structural component 110 to a height that is set according to certain needs. If needed, the power amplifier 130 can be directly fixed in the recessed areas on the surface of the structural component 110. The housing portions 116 are formed at the two sides of the power amplifier 130.

The circuit board 120 is fixedly connected to the first surface 112 of the structural component 110. A slot 126 is also set face to face with the raised portion 118 on the circuit board 120.

Because the housing portions 116 form recessed areas on the surface of the structural component 110, a pair of overhead matching areas 128 is formed in the positions face to face with the recessed areas at the two sides of the slot 126 on the circuit board 120 attached to the surface of the structural component 110. The matching areas 128 include a third surface 1282 face to face with the structural component 110, and a fourth surface 1284 face to face with the third surface 1282. An electric contact 1272 and an electric contact 1274 are attached to the third surface 1282 and the fourth surface 1284 respectively. The electric contact 1272 or the electric contact 1274 is electrically connected to a circuit (not shown) on the circuit board 120. At least one through hole 125 is also set in the matching areas 128. An electrically conductive material is attached on an inner side of the at least one through hole 125 to electrically connect the electric contacts 1272 and 1274, so that the electric contacts on the fourth surface 1284 and the third surface 1282 collectively form a power amplification matching portion 127, thus realizing the impedance matching between the power amplifier 130 and the circuits and electronic devices on the circuit board 120. In this embodiment, the electric contact 1272 and the electric contact 1274 have the same size. In other alternative embodiments, if only the power amplification matching portion 127 has certain impedance, the size of the electric contact 1272 and the size of the electric contact 1274 can be adjusted separately according to actual needs. It should be noted that, in this embodiment, the circuit board 120 is a single-layer board, but in other embodiments, the circuit board 120 may be a multi-layer board, that is to say, at least one conductive intermediate layer can further exist between the electric contacts 1272 and 1274 on the circuit board 120. In this case, the at least one conductive intermediate layer is connected to the electric contacts 1272 and 1274 via the through hole 125, so that the at least one conductive intermediate layer, the electric contact 1272, and the electric contact 1274 collectively form the power amplification matching portion 127.

The power amplifier 130 includes a base 132, a body 134 fixedly connected to the base 132, and a pair of pins 136 electrically connected to electronic devices in the body 134. The base 132 is fixedly connected to the raised portion 118 by the slot 126. The pins 136 are lapped on the power amplification matching portion 127 respectively, so that the power amplifier 130, assisted by the power amplification matching portion 127, can meet the requirements of impedance matching of circuits on the circuit board and other electronic devices, thus improving the power amplification performance of the power amplifier 130. It should be noted that, in this embodiment, the pins 136 are lapped on the electric contact 1274 of the fourth surface 1284 in the matching areas 128. In other embodiments, the pins 136 can also be fixedly connected to the electric contact 1272 respectively according to actual needs. It should be easily understood that, the adaptation of the height of the raised portion 118 is conducted for the installation of the power amplifier 130, and for the needs of electrically connecting the pins 136 to the power amplification matching portion 127.

In this embodiment, the electric contacts 1272 and 1274 on the third surface and the fourth surface of the matching areas 128 are electrically connected together, so the electric contacts 1272 and 1274 collectively form a power amplification matching portion 127. Moreover, the structural component 110 is grounded, and thus the power amplification matching portion 127 will directly refer to the bottom surface of the housing portion 114 as a reference layer 115 when performing impedance matching. A medium of various materials can be filled in to the housing portion 114 to act as an intermediate medium of the power amplification matching portion 127 to perform impedance matching, thus meeting all kinds of needs. The medium filled in the housing portion 114 includes air.

Accordingly, for the power amplifier 100 disclosed in the present invention, the housing portions 114 needs to be filled with only an applicable medium, such as a high-frequency medium or air, and boards of relatively cheap materials can be used for the circuit board 120 according to actual needs, thus effectively reducing the costs.

Furthermore, under equivalent conditions (including the material for an intermediate medium, the frequency of a signal, and the like), to realize the equivalent impedance matching, the thickness of the intermediate medium directly affects the selection of the size of the power amplification matching portion 127 required by wiring. Speaking, if the intermediate medium is thinner, the size of the power amplification matching portion 127 that needs to be laid to realize the equivalent impedance matching is smaller. The thickness of the intermediate medium of the power amplifier 100 disclosed in the embodiments of the present invention only depends on the depth of the recessed area, that is, the housing portion 114, on the structural component 110, which makes it convenient to fabricate and control. Therefore, the size of the power amplification matching portion 127 of the power amplifier 130 of the power amplifier according to of the embodiments of the present invention can be easily controlled within a certain range, thus meeting the requirements of highly intensified wiring on a circuit board in the present electronic industry.

It should be noted that, in this embodiment, the structural component 110 is made of an electrically conductive material, and in other embodiments, the structural component 110 can also be made of materials other than electrically connected ones. Correspondingly, to provide a current loop to the power amplification matching portion 127 for reference, a grounded conductive layer (not shown) is attached to the bottom surface of the housing portion 114, to act as a reference layer for the power amplification matching portion 127 to perform impedance matching.

It should be easily understood that, in this embodiment, the power amplifier 130 is set on the structural component 110 by the slot 126; however, in other alternative embodiments, the power amplifier 130 can also be directly set on the surface of the circuit board 120 or formed in the recessed area on the surface of the circuit board 120. Correspondingly, the housing portions 116 related to the power amplification matching portions 127 of the power amplifier 130 are set between the circuit board 120 and the structural component 110, to be filled with an intermediate medium.

It should be easily understood that, the structural component 110 can be made of a material with good thermal conductivity to help the power amplifier dissipate heat.

Figure 4:
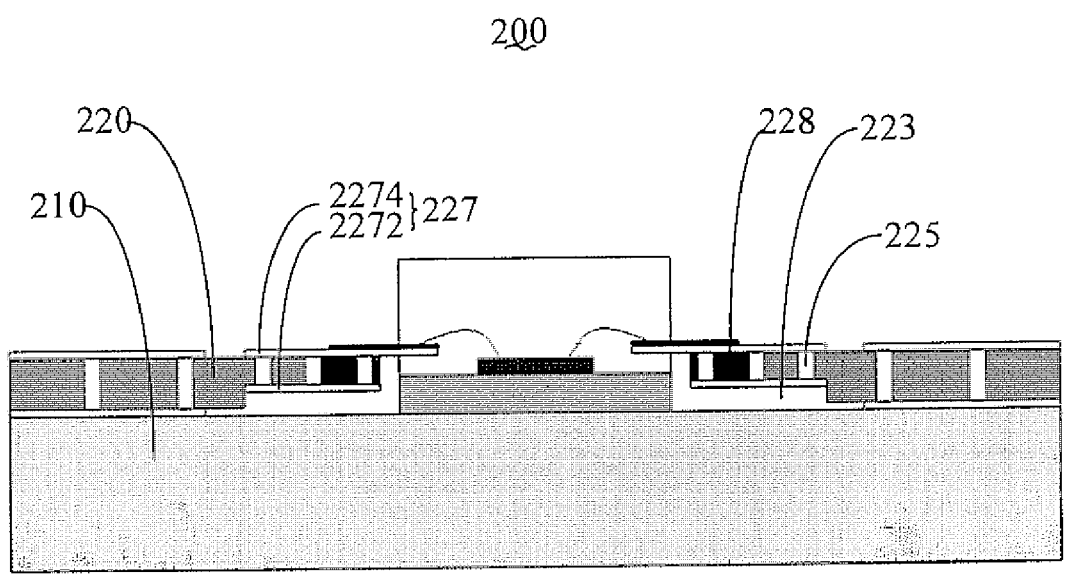
FIG. 4 is a structural schematic diagram of another power amplifier according to an embodiment of the present invention.

FIG. 4 is a schematic diagram of a power amplifier 200 according to a second embodiment of the present invention. The power amplifier 200 includes a structural component 210, a circuit board 220, and a power amplifier 230. The description of the same parts is not provided. The difference between the second embodiment and the first embodiment lies in that: no recessed portion is set on the structural component 210. In this embodiment, a recessed portion is set at the side face to face with the structural component 210 of a matching area 228 of the circuit board 220. The recessed portion, the circuit board 220, and the structural component 210 collectively form a housing portion 223 between the circuit board 220 and the structural component 210. Electric contacts 2272 and 2274, which are used to form a power amplification matching portion 227, are respectively located on the bottom of the recessed portion and the surface face to face with the bottom of the recessed portion of the matching area 228. The electric contacts 2272 and 2274 are electrically connected via at least one through hole 225 in the matching area 228.

It should be easily understood that, in both the power amplifiers of the first embodiment and the second embodiment of the prevention, conducted electric contacts attached to the surfaces face to face with each other of a circuit board collectively form a power amplification matching portion, a housing space is formed between the power amplification matching portion and a reference layer, and the housing space is filled with an intermediate medium, to meet various needs. Therefore, the power amplifiers in the first embodiment and the second embodiment of the present invention use the same technical solution and achieve the same technical effectiveness.

Of course, persons skilled in the art can also make other modifications and variations of the present invention without departing from the spirit and scope of the present invention. Thus, if the modifications and variations of the present invention are covered by the claims and other equivalent technologies of the present invention, the present invention also intends to include these modifications and variations.

What is claimed is:

1. A power amplifier, comprising a circuit board, a power amplifier, and a structural component, wherein the circuit board is set on the structural component, the power amplifier is set on the circuit board and/or the structural component, the power amplifier comprises a pair of pins, a grounding reference layer is set face to face with the circuit board on the structural component, wherein a pair of housing portions is set between the circuit board and the structural component, a pair of overhead matching areas is also set face to face with the housing portions on the circuit board, power amplification matching portions are set face to face with the reference layer on the matching areas respectively, and the pair of pins are electrically connected to the power amplification matching portions respectively, wherein the matching areas comprise a third surface face to face with the reference layer and a fourth surface face to face with the third surface, electric contacts are set on the third surface and the fourth surface each, the electric contacts on the third surface and the fourth surface of the matching areas are electrically connected to each other, and collectively form the power amplification matching portions.

2. The power amplifier according to claim 1, wherein a slot is set on the circuit board, and the power amplifier is fixedly connected to the structural component by the slot.

3. The power amplifier according to claim 1, wherein the structural component is made of an electrically conductive material, and is grounded.

4. The power amplifier according to claim 1, wherein a through hole is set in the matching area, and the electric contact on the third surface of the matching areas is electrically connected to the electric contact on the fourth surface via the through hole.

5. The power amplifier according to claim 1, wherein the housing portions are recessed at the side face to face with the circuit board of the structural component.

6. The power amplifier according to claim 1, wherein the housing portions are recessed at the side face to face with the structural component of the matching portions.

7. A signal transmitting system, comprising a power amplifier, a filter, and an antenna component, wherein the power amplifier comprises a circuit board, a power amplifier, and a structural component, the circuit board is set on the structural component, the power amplifier is set on the circuit board and/or the structural component, the power amplifier comprises a pair of pins, a grounding reference layer is set face to face with the circuit board on the structural component, wherein a pair of housing portions is set between the circuit board and the structural component, overhead matching areas are set face to face with the housing portions on the circuit board respectively, power amplification matching portions are set face to face with the reference layer on the matching areas respectively, and the pins are electrically connected to the power amplification matching portions respectively, wherein the matching areas comprise a third surface face to face with the reference layer and a fourth surface face to face with the third surface, electric contacts are set on the third surface and the fourth surface each, the electric contacts on the third surface and the fourth surface of the matching areas are electrically connected to each other, and collectively form the power amplification matching portions.

8. The signal transmitting system according to claim 7, wherein the structural component is made of an electrically conductive material, and is grounded.

9. The signal transmitting system according to claim 7, wherein a through hole is set in the matching areas, and the electric contact on the third surface of the matching area is electrically connected to the electric contact on the fourth surface via the through hole.

10. The signal transmitting system according to claim 7, wherein the housing portions are recessed at the side face to face with the circuit board of the structural component.

11. The signal transmitting system according to claim 7, wherein, the housing portions are recessed at the side face to face with the structural component of the matching portions.

12. The signal transmitting system according to claim 7, wherein a slot is set on the circuit board, and the power amplifier is fixedly connected to the structural component by the slot.

* * * * *